United States Patent
Kuo et al.

(10) Patent No.: US 7,715,260 B1
(45) Date of Patent: May 11, 2010

(54) OPERATING VOLTAGE TUNING METHOD FOR STATIC RANDOM ACCESS MEMORY

(75) Inventors: Chien-Li Kuo, Hsinchu (TW); Fu-Chao Liu, Taoyuan County (TW); Chun-Liang Hou, Hsinchu County (TW); Min-Chin Hsieh, Hsinchu County (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 36 days.

(21) Appl. No.: 12/325,747

(22) Filed: Dec. 1, 2008

(51) Int. Cl.
*G11C 7/00* (2006.01)
(52) U.S. Cl. ...................... 365/201; 714/718
(58) Field of Classification Search ............... 365/201, 365/154; 714/718, 733, 721
See application file for complete search history.

(56) References Cited

U.S. PATENT DOCUMENTS

| 5,936,892 | A | 8/1999 | Wendell | |
|---|---|---|---|---|
| 7,200,057 | B2 | 4/2007 | Pineda De Gyvez et al. | |
| 7,222,274 | B2 * | 5/2007 | Combs et al. | 714/721 |
| 2005/0188287 | A1 * | 8/2005 | Combs et al. | 714/718 |
| 2006/0259840 | A1 * | 11/2006 | Abadeer et al. | 714/733 |

* cited by examiner

*Primary Examiner*—Son Dinh
(74) *Attorney, Agent, or Firm*—Winston Hsu

(57) ABSTRACT

An operating voltage tuning method for a static random access memory is disclosed. The static random access memory receives a periphery voltage and a memory cell voltage. The steps of the method mentioned above are shown as follows. First, perform a shmoo test on the static random access memory to obtain a shmoo test plot and a minimum operating voltage. Compare the minimum operating voltage with a preset specification. Position a specification position point on the line which the periphery voltage is equal to the memory cell voltage in the shmoo test plot corresponding to the preset specification. Fix one of the memory cell voltage and the periphery voltage and gradually decrease the other to test the static random access memory and obtain a failure bits distribution. Finally, tune process parameters of the static random access memory according to the specification position point and the failure bits distribution.

12 Claims, 5 Drawing Sheets

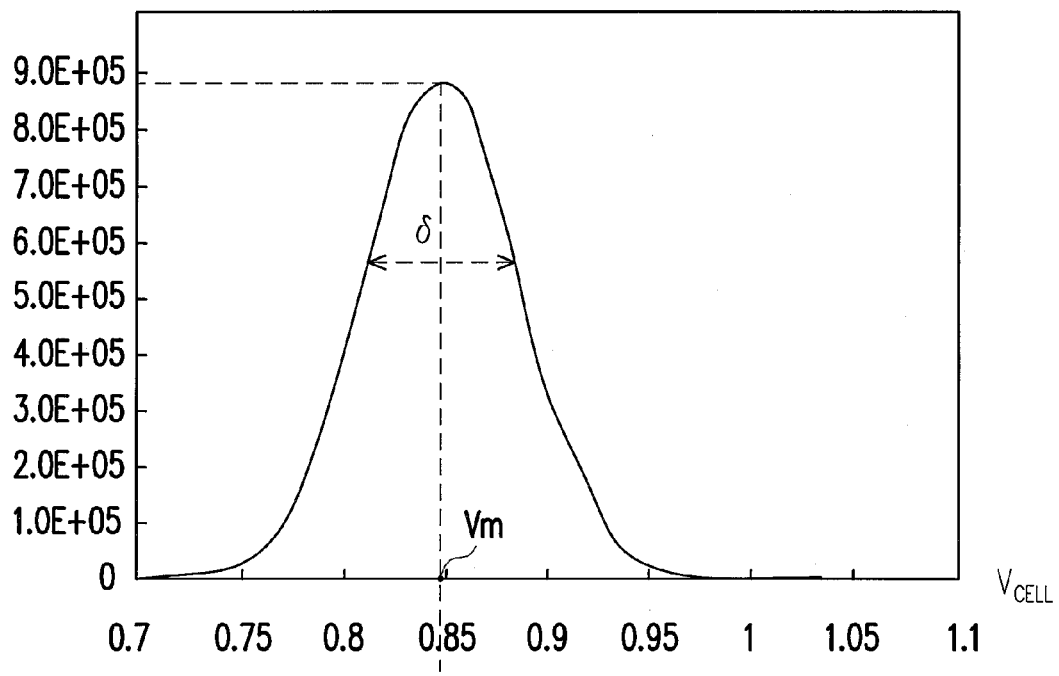
FIG. 4          400
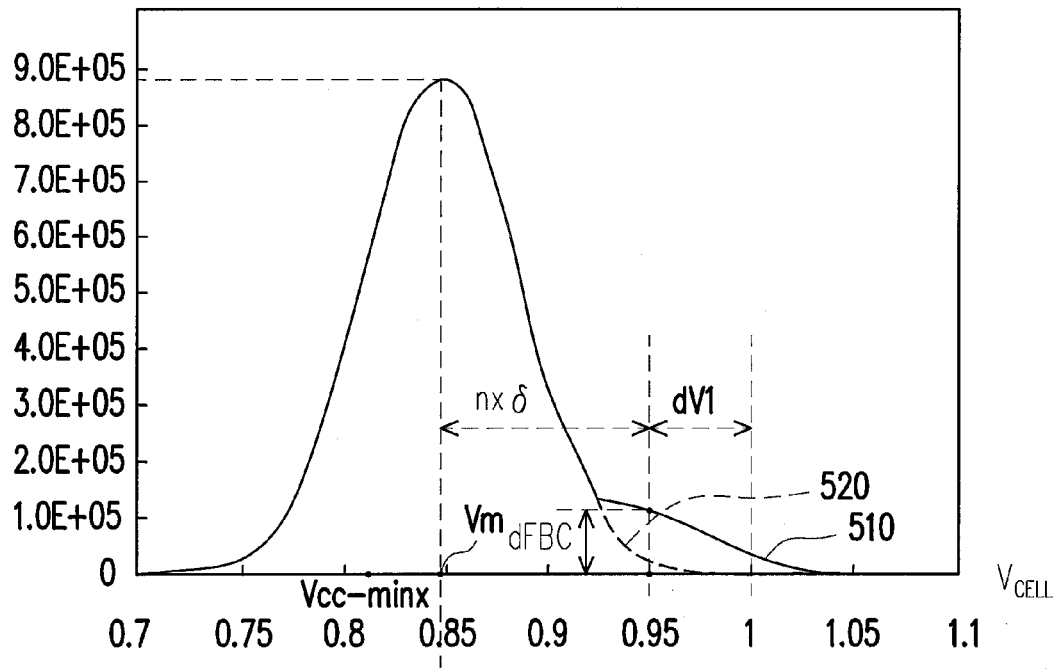
FIG. 5          500

OPERATING VOLTAGE TUNING METHOD FOR STATIC RANDOM ACCESS MEMORY

BACKGROUND OF THE INVENTION

1. Field of the Invention

The present invention relates to a tuning method of process parameters of a memory and more particularly, to a tuning method of minimizing operating voltage for a static random access memory.

2. Description of Related Art

The Static Random Access Memory (SRAM) is a common random access memory. A feature of the SRAM lies in that as long as power is supplied to the SRAM, data stored in the SRAM will not be lost. This is different from a dynamic random access memory (DRAM) which has to periodically re-flash data lines. As a result, the SRAM still plays an irreplaceable role in today's electronic products.

The common SRAM has a so-called 6T structure comprising six transistors. Referring to FIG. 1, FIG. 1 shows a circuit diagram of a conventional 6T SRAM. FIG. 1 illustrates an SRAM 100 of size 1 bit. The SRAM 100 mainly comprises 4 transistors PL1, PD1, PL2, and PD2 which form a latched circuit to store data. Transistors PG1 and PG2 are respectively switches controlled by a word line WL. When the SRAM 100 is selected (to be written into or read from), the transistors PG1 and PG2 are turned on simultaneously and data is transmitted through a bit line BL and an inversion bit line BLB so as to perform data access. The SRAM 100 in FIG. 1 is merely a 1-bit memory unit, which, however, exists in a great quantity in one or a plurality of memory arrays having capacity of several million bits.

A so-called shmoo test is commonly used to test and analyze the SRAM. The shmoo test is often used for analysis of semiconductor circuits and generally for repetitively testing the operating voltage of the to-be-tested circuit having capacity of several million bits by gradually increasing or decreasing the operating voltage to evaluate the quality distribution of the to-be-tested circuit at various operating voltages. Referring simultaneously to both FIG. 1 and FIG. 2, FIG. 2 illustrates a distribution of the SRAM under the shmoo test. The horizontal axis in FIG. 2 represents a memory cell voltage $V_{Cell}$ applied on the transistors PL1, PL2, PD1, and PD2 and the vertical axis represents a periphery voltage $V_{PERI}$ applied on the transistors PG1 and PG2. The stars in FIG. 2 represent the voltages at which all the SRAM in the circuit under test can work normally, while the blank areas represent the voltages at which not all the SRAM in the circuit under test can work normally.

In addition, a straight line 210 represents the situation when the memory cell voltage $V_{Cell}$ is equal to the periphery voltage $V_{PERI}$. A dot PT on the straight line 210 is where a minimal operating voltage Vcc_min of the SRAM under test occurs.

In general, the reasons why failure occurs in the SRAM include inevitable errors in the manufacturing process (generally referred to as early fail) in addition to two main factors, one being Static Noise Margin (SNM), and the other being Write Noise Margin (WMN). The latter two factors respectively represent noise tolerance of the SRAM when being read and written. Moreover, these two factors are usually inverse. That is, the SRAM having higher SNM usually has lower WNM and vice versa. As a result, when the SRAM needs to operate on a lower operating voltage, a designer has difficulty adjusting corresponding process parameters.

The abovementioned shmoo test can only indicate whether the failure of the SRAM under test is caused by the WNM or the SNM. Therefore, the shmoo test can not provide the designer enough information to properly adjust the process parameters of the SRAM corresponding to the SNM or the WNM and to further adjust the minimal operating voltage. Meanwhile, the shmoo test also can not provide information regarding whether there are early fail bits inherent therein.

SUMMARY OF THE INVENTION

The present invention provides an operating voltage tuning method for a static random access memory (SRAM) to lower the operating voltage of the SRAM.

The present invention provides an operating voltage tuning method for an SRAM. The static random access memory receives a periphery voltage and a memory cell voltage. The steps of the method comprise the following. First, perform a shmoo test on a plurality of the SRAM so as to obtain a shmoo test plot and a minimum operating voltage. The shmoo test plot has a successful test distribution zone. Next, compare the minimum operating voltage with a preset specification. Afterwards, position a specification position point on a line on which the periphery voltage is equal to the memory cell voltage of the shmoo test plot corresponding to the preset specification. Furthermore, fix one of the periphery voltage and the memory cell voltage and gradually decrease the other to test the plurality of the SRAM and thereby obtain a failure bits distribution. Finally, tune process parameters of the plurality of the SRAM according to the specification position point and the failure bits distribution.

In one embodiment of the present invention, steps of the abovementioned tuning process parameters of the plurality of the SRAM according to the specification position point and the failure bits distribution include the following. First, extend a first boundary line of the successful test distribution zone and horizontally shift the first boundary line for a horizontal shift distance so that the first boundary line passes the specification position point. Furthermore, extend a second boundary line of the successful test distribution zone and vertically shift the second boundary line for a vertical shift distance so that the second boundary line passes the specification position point. Afterwards, adjust the process parameters of the plurality of the SRAM according to the horizontal shift distance or vertical shift distance and a voltage at which a first failure bit occurs in the failure bits distribution.

In one embodiment of the present invention, a step of gradually decreasing the other of the periphery voltage and the memory cell voltage includes gradually decreasing the memory cell voltage from being equal to the periphery voltage to zero volt or gradually decreasing the periphery voltage from being equal to the memory cell voltage to zero volt.

In one embodiment of the present invention, the failure bits distribution is a number of failure bits of the SRAM corresponding to the gradually decreased memory cell voltage or the gradually decreased periphery voltage.

In one embodiment of the present invention, the failure bits distribution is a normal distribution.

In one embodiment of the present invention, the process parameters of the plurality of the SRAM are adjusted according to a standard deviation or a median of the failure bits distribution.

In one embodiment of the present invention, the abovementioned operating voltage tuning method for an SRAM further comprises the following. First, determine a theoretical voltage at which the memory cell voltage or the periphery voltage generates a first failure bit according to the standard deviation of the failure bits distribution. The interval between the theoretical voltage and the voltage at which the first failure bit actually occurs is an early fail interval. Then, adjust the process parameters of the plurality of the SRAM according to the abovementioned early fail interval.

In one embodiment of the present invention, the steps of the operating voltage tuning method for SRAM further include adjusting the process parameters of the plurality of the SRAM according to a number of failure bits corresponding to the theoretical voltage.

In one embodiment of the present invention, the abovementioned theoretical voltage is a multiple of the standard deviation of the failure bits distribution. The number of the multiple depends on the size of the SRAM.

In one embodiment of the present invention, the abovementioned shmoo test changes the memory cell voltage and the periphery voltage to perform test on the plurality of the SRAM.

In one embodiment of the present invention, the abovementioned shmoo test performs test on the plurality of the SRAM by performing a read and write test on the plurality of the SRAM.

In one embodiment of the present invention, the abovementioned successful test distribution zone indicates that all bits of the plurality of the SRAM may be normally read and written at the memory cell voltage and the periphery voltage corresponding to the successful test distribution zone.

The present invention uses the shmoo test plot generated from the shmoo test in association with the failure bits distribution to adjust the process parameters of the SRAM by means of statistics so as to adjust a minimum operating voltage of the SRAM. As such, not only is it possible to effectively differentiate the factor dominating the minimum operating voltage of the memory as being the SNM or the WNM, but statistics of the two parameters may also be obtained. Corresponding process parameters may also be further acquired and adjusted to effectively adjust the minimum operating voltage of the memory.

In order to make the aforementioned features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a schematic diagram of a failure bits distribution 400 according to the first embodiment of the present invention.

FIG. 5 is a schematic diagram of a failure bits distribution 500 according to the first embodiment of the present invention.

DESCRIPTION OF EMBODIMENTS

An illustration on the operating voltage tuning method for an SRAM according to the present invention is provided below along with several embodiments accompanied with diagrams for the better comprehension and implementation by those of ordinary skill in the art.

Figure 1:
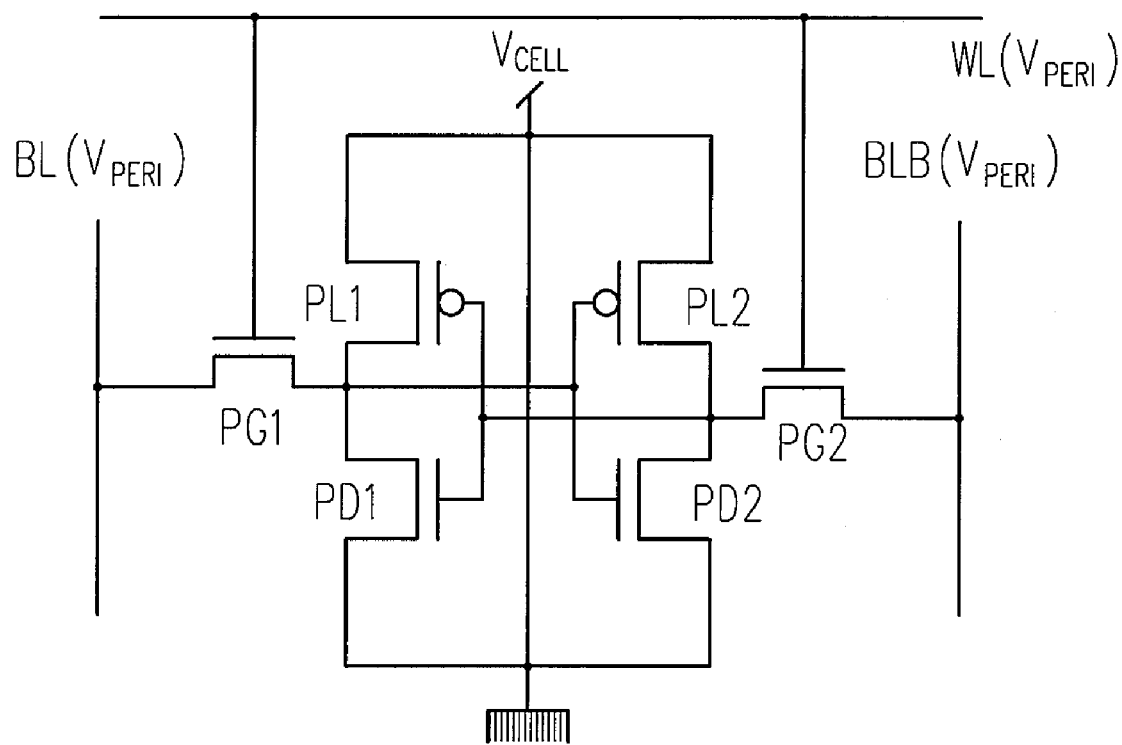
FIG. 1 is a circuit diagram of a conventional 6T SRAM.
Figure 2:
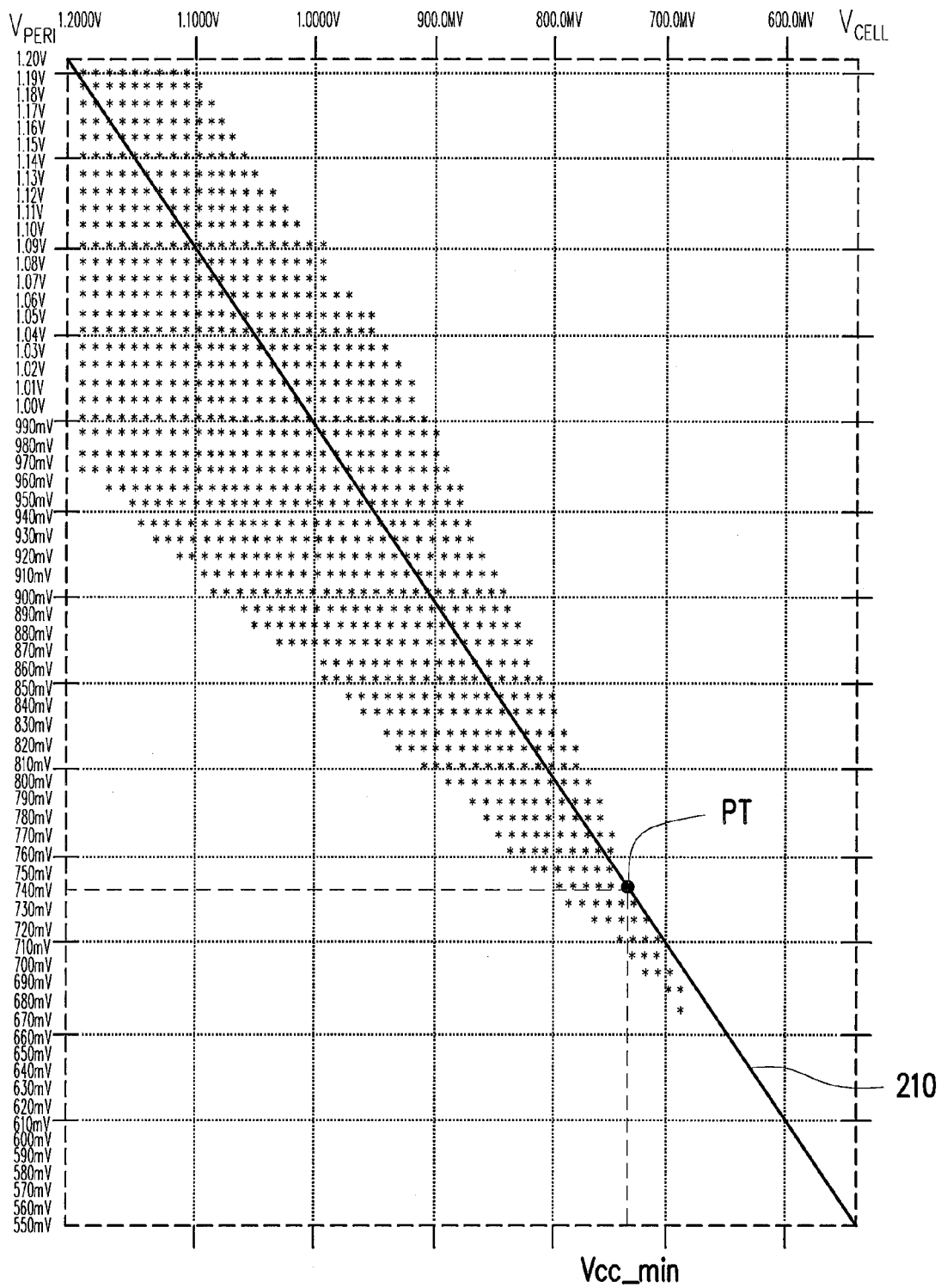
FIG. 2 is a distribution diagram of a shmoo test on an SRAM.
Figure 3A:
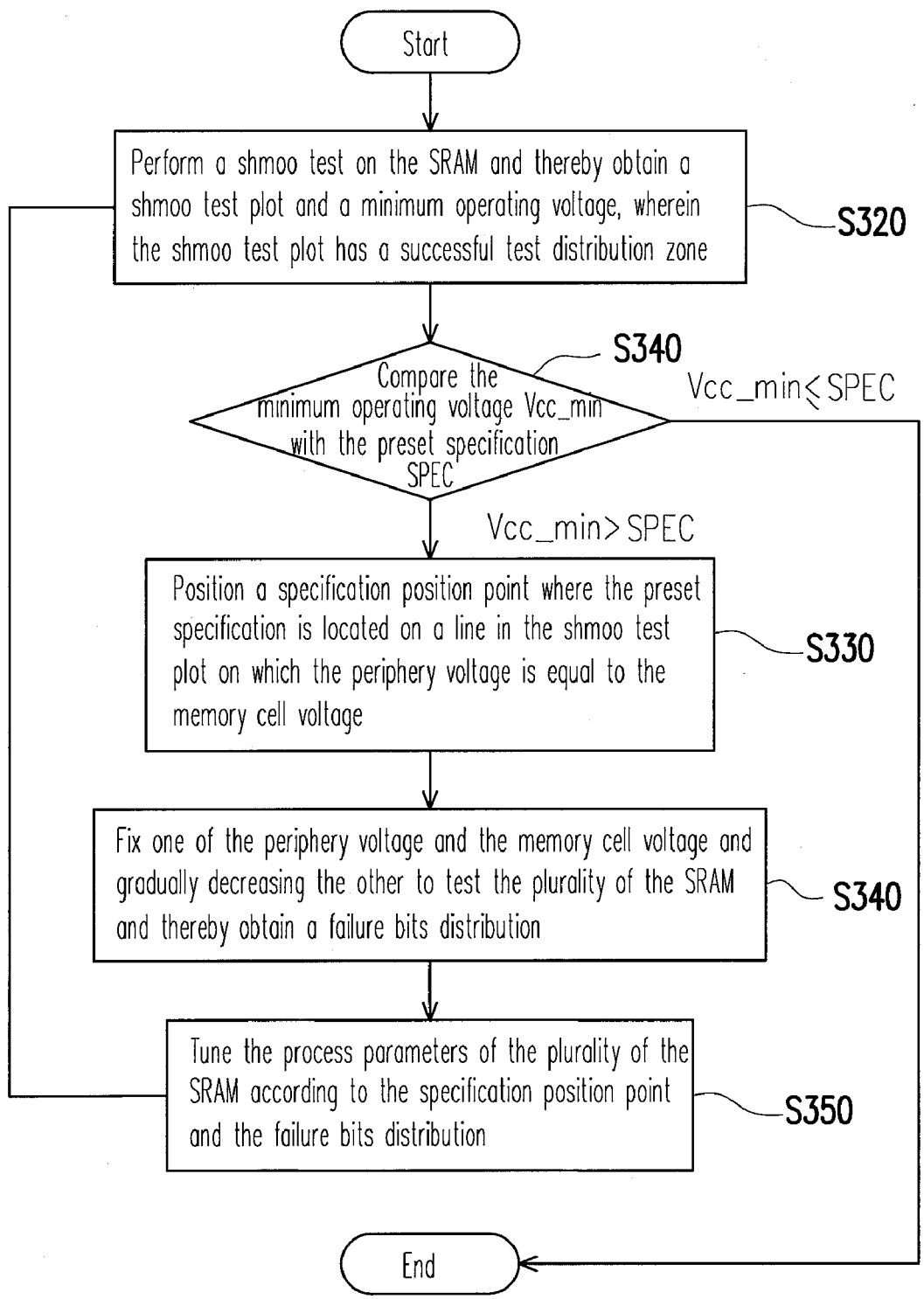
FIG. 3A is a flow chart of an operating voltage tuning method for an SRAM according to the first embodiment of the present invention.

Referring simultaneously to FIG. 1 and FIG. 3A, FIG. 3A is a flow chart illustrating the operating voltage tuning method for an SRAM according to a first embodiment of the present invention. Although an SRAM 100 is considered as a circuit under test throughout the specification, those of ordinary skill in the art should realize that the SRAM 100 merely represents an SRAM having millions of bits or more. The actual circuit under test may be a combination of SRAM having an arbitrary number of bits.

Figure 3B:
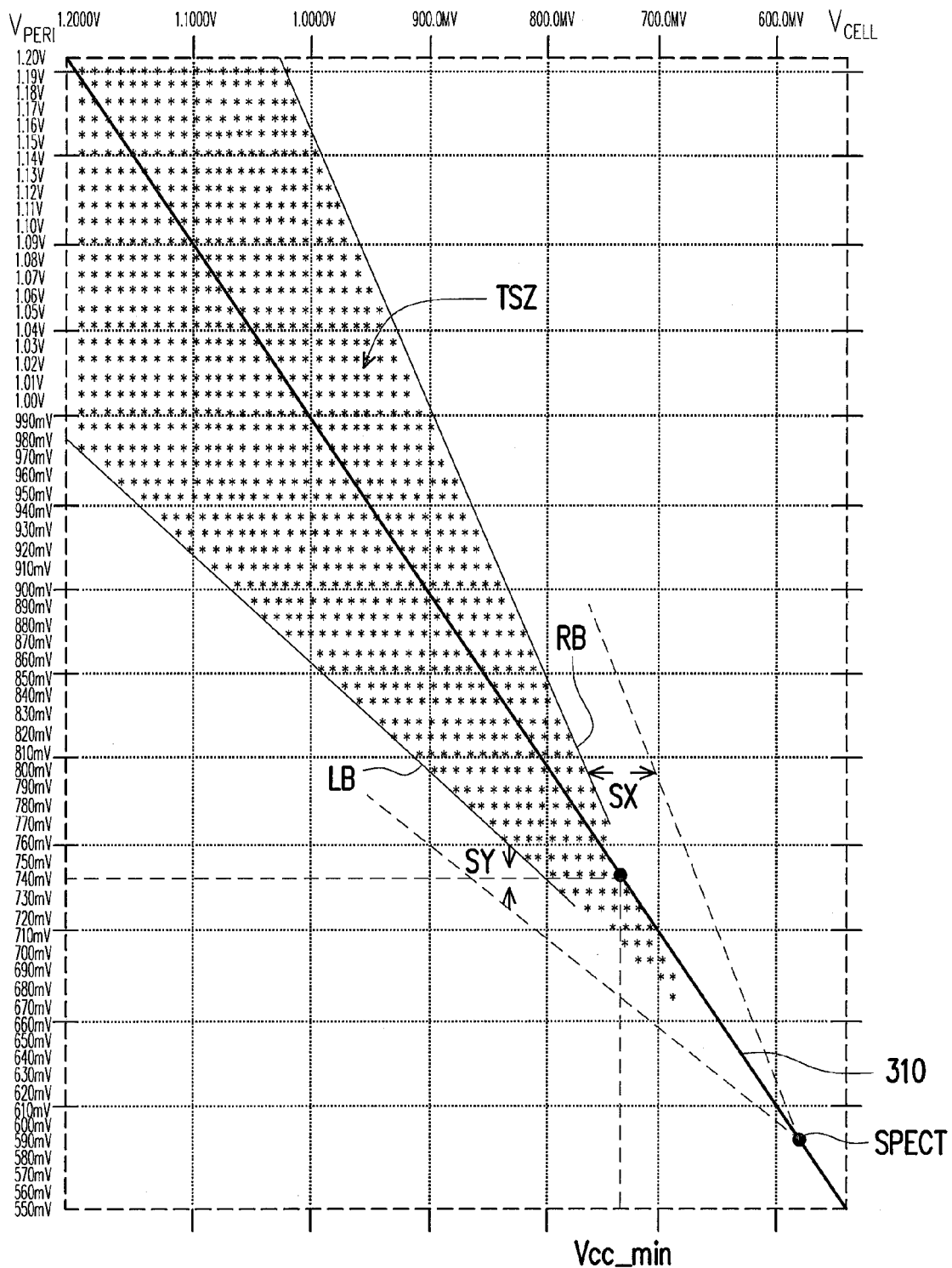
FIG. 3B illustrates a shmoo test plot according to the first embodiment of the present invention.

In the first embodiment, steps of tuning an operating voltage of the SRAM 100 include the following. First, perform a shmoo test (step S320) on the plurality of the SRAM 100 to be tested, wherein the shmoo test performs test on the access functionality of the SRAM 100 by changing a memory cell voltage $V_{CELL}$ and a periphery voltage $V_{PERI}$. In addition, a shmoo test plot, as shown in FIG. 3B illustrating the first embodiment of the present invention, may be obtained through the abovementioned shmoo test. A minimum operating voltage Vcc_min of the SRAM 100 may also be obtained.

Referring to FIG. 3B, the area marked with stars (*) in the shmoo test plot shown in FIG. 3B is the so-called successful test distribution zone TSZ. The successful test distribution zone TSZ means that all bits of the SRAM 100 under test may be normally read and written at the memory cell voltage $V_{CELL}$ and the periphery voltage $V_{PERI}$ corresponding to the zone. In other words, the area outside the successful test distribution zone TSZ means that at least one bit of the SRAM 100 under test has read or write failure at the corresponding memory cell voltage $V_{CELL}$ and periphery voltage $V_{PERI}$.

Referring again to FIG. 3A, continue the steps of tuning the operating voltage of the plurality of the SRAM. Next, compare the minimum operating voltage Vcc_min with a preset specification SPEC (step S340). The preset specification SPEC is the target value to tune the operating voltage of the plurality of the SRAM 100. Once the minimum operating voltage Vcc_min is greater than the preset specification SPEC, this means that tuning the operating voltage is not complete; in contrast, if the minimum operating voltage Vcc_min is smaller than or equal to the preset specification SPEC, this means that tuning the operating voltage is complete.

If it is determined that tuning the operating voltage is not complete, referring again to FIG. 3B, set a specification position point SPECT where the preset specification SPEC is on a line 310 in the shmoo test plot where the periphery voltage is equal to the memory cell voltage (step S330). Then, find a first boundary line RB and a second boundary line LB of the successful test distribution zone TSZ. Extend the first boundary line RB and horizontally shift the first boundary line RB for a horizontal shift distance SX so that the first boundary line RB passes the specification position point SPECT. Similarly, also extend the second boundary line LB and horizontally shift the second boundary line LB for a vertical shift distance SY so that the second boundary line LB also passes the specification position point SPECT.

Referring again to FIG. 3A, proceed to step S340. Step S340 is to fix one of the periphery voltage $V_{PERI}$ and the memory cell voltage $V_{CELL}$, wherein the fixed periphery voltage $V_{PERI}$ and memory cell voltage $V_{CELL}$ is fixed at an original standard operating voltage. In addition, the other one of the periphery voltage $V_{PERI}$ or the memory cell voltage $V_{CELL}$ is gradually decreased so as to perform test on the SRAM 100 and obtain the failure bits distribution (FBC). Simply speaking, when fixing the periphery voltage $V_{PERI}$, the memory cell voltage $V_{CELL}$ is gradually decreased to perform test on the SRAM 100. In contrast, when fixing the memory cell voltage $V_{CELL}$, the periphery voltage $V_{PERI}$ is gradually decreased to perform test on the SRAM 100. Through the above test, a so-called failure bits distribution may be obtained.

Referring to FIG. 4 for an illustration on the failure bits distribution, FIG. 4 is a schematic diagram of a first failure bits distribution 400 according to the first embodiment of the present invention. The horizontal axis represents the gradually decreased voltage at step S340. Take decreasing the memory cell voltage $V_{CELL}$ as an example. Suppose the periphery voltage $V_{PERI}$ is fixed at 1.1V. The memory cell voltage $V_{CELL}$ is gradually decreased from 1.1V to 0V. FIG. 4 only shows the failure bits distribution when the memory cell voltage $V_{CELL}$ is gradually decreased from 1.1V to 0.7V because all memory cells have been included in the interval between 0.7V and 1.1V. The periphery voltage $V_{PERI}$ is selectively fixed at 1.1V because the normal operating voltage of the SRAM 100 is 1.1V, at which the SRAM 100 may steadily and normally operate. In addition, the vertical axis of the failure bits distribution 400 represents a number of failure bits which occur corresponding to the memory cell voltage $V_{CELL}$. When the periphery voltage $V_{PERI}$ is fixed, each memory cell corresponds to a minimum operating voltage which is equal to the memory cell voltage $V_{CELL}$. Therefore, FIG. 4 may be regarded as a distribution of the minimum operating voltage $V_{min\_x}$.

The failure bits distribution 400 presents a normal distribution with the most failures occurring when the memory cell voltage $V_{CELL}$ ($V_{min\_x}$) is about 0.85V and the corresponding largest number of failure bits is just below 900,000 bits. The memory cell voltage $V_{CELL}$ at this time is a median Vm of the failure bits distribution 400.

Refer simultaneously to FIG. 3A and FIG. 4 for the illustration below. After completing the above step S340, in step S350, adjust process parameters of the SRAM according to the horizontal shift distance SX or the vertical shift distance SY and a voltage at which a first failure bit occurs in the failure bits distribution 400. Specifically, use the voltage at which a first failure bit occurs in the failure bits distribution 400 and compare the statistics graph with a statistics graph generated from a previous generation process that has been tested to see if the median Vm, standard deviation, or early failure (acquisition of early failure will be illustrated below) needs to be adjusted so that the voltage at which the first failure bit occurs can be shifted to lower the SX or the SY (if $V_{PERI}$ is fixed and the failure bits distribution of $V_{CELL}$ is adjusted, the SX of the voltage at which the first failure bit occurs needs to be lowered; if $V_{CELL}$ is fixed and the failure bits distribution of $V_{PERI}$ is adjusted, the SY of the voltage at which the first failure bit occurs needs to be lowered), and subsequently adjust process conditions corresponding to the parameter to be adjusted (e.g. the median).

With respect to the abovementioned process condition corresponding to the parameter to be adjusted, if the parameter to be adjusted is the median, the process condition such as ion implantation dosage is correspondingly adjusted to change the electrical current ratio between N-type transistors and P-type transistors; if the parameter to be adjusted is the standard deviation, the adjustment may be achieved by improving process uniformity of electrical elements on the memory (e.g. uniform distribution of CD resulted from an etching process and a photolithography process; uniform film thickness distribution resulted from an etching, thin film, diffusion, and chemical mechanical polishing). To improve early failure, perform a failure analysis (FA) to find the process condition corresponding to the improvement.

It should be noted that the failure bits distribution generated from performing the test of step S340 on the SRAM may not necessarily present a perfect normal distribution as shown in FIG. 4. Referring to FIG. 5, FIG. 5 is a schematic diagram of another failure bits distribution 500 according to the first embodiment of the present invention. A curve 510 represents the failure bits distribution of an actual test, while a curve 520 represents the failure bits distribution which should be a normal distribution in theory. In an interval dV1, the two curves have a great difference which is the early fail resulting from unavoidable problems during manufacturing process. The early fail may be improved by adjusting process parameters but can not be eliminated by adjusting the median or standard deviation of the distribution. Therefore, the early fail has to be a third improvement factor independent from the median and the standard deviation.

To decrease the abovementioned early fail, the interval dV1 has to be accurately calculated. In theory, the difference between a theoretical voltage V1 at which the first failure bit occurs and the median Vm of the failure bits distribution should be a multiple of the standard deviation. The theoretical voltage V1 can be obtained using the multiple relationship, wherein V1=Vm+δ×n. The multiple n is related to the memory capacity of the SRAM under test. When the memory capacity is 4 mega bytes, n is equal to 5.04, when the memory capacity is 8 mega bytes, n is equal to 5.17, when the memory capacity is 16 mega bytes, n is equal to 5.30, and when the memory capacity is 32 mega bytes, n is equal to 5.42.

After calculating the theoretical voltage V1 and obtaining a voltage V2 at which the first failure bit actually occurs from the failure bits distribution 510 of an actual test, the interval dV1 can be calculated. The value of the interval dV1 is the difference in voltages at which the first failure bit occurs between theory and practice.

In addition, the voltage at which the early fails occur is important and so is the number of the early fails. Therefore, the number of actual failure bits dFBC corresponding to the theoretical voltage V1 can also be used to adjust the process parameters.

Furthermore, in the above first embodiment, the tuning method of process parameters may base on the failure bits distribution. For example, move the median of the failure bits distribution or increase/decrease the standard deviation of the failure bits distribution. However, the most important point is that when the periphery voltage is fixed and the memory cell voltage is gradually decreased, the main factor influencing failure of the SRAM under test is the SNM of the SRAM. Thus, correspondingly adjusting related circuits of the SNM can accurately adjust the failure bits distribution (e.g. adjusting implantation dosage of a threshold voltage of the N-type transistors or increasing channel length of the transistors).

In contrast, when the memory cell voltage is fixed and the periphery voltage is gradually decreased, the main factor influencing failure of the SRAM under test is the WNM of the SRAM. Thus, correspondingly adjusting related circuits of the WNM can accurately adjust the failure bits distribution. The method of adjusting the process parameters is similar to the abovementioned and will not be further illustrated herein.

In summary, the present invention performs test on the SRAM by separately testing the memory cell voltage and the periphery voltage to effectively analyze whether the main factor influencing the minimum operating voltage of the SRAM is the SNM or the WNM. The process parameters are correspondingly adjusted to increase the accuracy of the tuning process.

It will be apparent to those of ordinary skills in the technical field that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An operating voltage tuning method for an SRAM, wherein the SRAM receives a periphery voltage and a memory cell voltage and the steps of the method comprise:

performing a shmoo test on a plurality of the SRAM and thereby obtaining a shmoo test plot and a minimum operating voltage, wherein the shmoo test plot has a successful test distribution zone;

comparing the minimum operating voltage with a preset specification;

positioning a specification position point where the preset specification is located on a line in the shmoo test plot on which the periphery voltage is equal to the memory cell voltage;

fixing one of the periphery voltage and the memory cell voltage and gradually decreasing the other to test the plurality of the SRAM and thereby obtain a failure bits distribution; and tuning process parameters of the plurality of the SRAM according to the specification position point and the failure bits distribution.

2. The operating voltage tuning method for an SRAM according to claim 1, wherein the step of tuning process parameters of the plurality of the SRAM according to the specification position point and the failure bits distribution comprises:

extending a first boundary line of the successful test distribution zone and horizontally shifting the first boundary line for a horizontal shift distance so that the first boundary line passes the specification position point;

extending a second boundary line of the successful test distribution zone and vertically shifting the second boundary line for a vertical shift distance so that the second boundary line passes the specification position point; and adjusting the process parameters of the plurality of the SRAM according to the horizontal shift distance or vertical shift distance and a voltage at which a first failure bit occurs in the failure bits distribution.

3. The operating voltage tuning method for an SRAM according to claim 1, wherein the step of gradually decreasing the other (of the periphery voltage and the memory cell voltage) is to gradually decrease the memory cell voltage from being equal to the periphery voltage to 0V or to gradually decrease the periphery voltage from being equal to the memory cell voltage to 0V.

4. The operating voltage tuning method for an SRAM according to claim 1, wherein the failure bits distribution is a number of failure bits of the plurality of the SRAM generated corresponding to gradually decreasing the memory cell voltage or the periphery voltage.

5. The operating voltage tuning method for an SRAM according to claim 1, wherein the failure bits distribution is a normal distribution.

6. The operating voltage tuning method for an SRAM according to claim 5, comprising adjusting the process parameters of the plurality of the SRAM by adjusting the standard deviation or the median of the failure bits distribution.

7. The operating voltage tuning method for an SRAM according to claim 1, the steps further comprising:

determining a theoretical voltage at which the memory cell voltage or the periphery voltage generates a first failure bit according to the standard deviation of the failure bits distribution, wherein an interval between the theoretical voltage and a voltage at which a first failure bit actually occurs is an early fail interval; and adjusting the process parameters of the plurality of the SRAM according to the early fail interval.

8. The operating voltage tuning method for an SRAM according to claim 7, the steps further comprising:

adjusting the process parameters of the plurality of the SRAM according to a number of failure bits corresponding to the theoretical voltage.

9. The operating voltage tuning method for an SRAM according to claim 7, wherein the theoretical voltage is a multiple of the standard deviation of the failure bits distribution and a number of the multiple depends on a size of the SRAM.

10. The operating voltage tuning method for an SRAM according to claim 1, wherein the shmoo test performs test on the SRAM by changing the memory cell voltage and the periphery voltage.

11. The operating voltage tuning method for an SRAM according to claim 1, wherein the shmoo test performs test on the plurality of the SRAM by performing a read and write test on the plurality of the SRAM.

12. The operating voltage tuning method for an SRAM according to claim 1, wherein the successful test distribution zone indicates that all bits of the plurality of the SRAM may be normally read and written at the memory cell voltage and the periphery voltage corresponding to the successful test distribution zone.

* * * * *